US009888537B2

(12) United States Patent
Lee et al.

(10) Patent No.: US 9,888,537 B2
(45) Date of Patent: Feb. 6, 2018

(54) LED ILLUMINATOR APPARATUS, USING MULTIPLE LUMINESCENT MATERIALS DISPENSED ONTO AN ARRAY OF LEDS, FOR IMPROVED COLOR RENDERING, COLOR MIXING, AND COLOR TEMPERATURE CONTROL

(71) Applicant: DiCon Fiberoptics, Inc., Richmond, CA (US)

(72) Inventors: Ho-Shang Lee, El Sobrante, CA (US);
Brian I-Yuan Chiang, El Sobrante, CA (US); Junying Lu, Castro Valley, CA (US); Robert Eric Schleicher, Danville, CA (US)

(73) Assignee: DICON FIBEROPTICS, INC., Richmond, CA (US)

( * ) Notice: Subject to any disclaimer, the term of this patent is extended or adjusted under 35 U.S.C. 154(b) by 130 days.

(21) Appl. No.: 14/853,497

(22) Filed: Sep. 14, 2015

(65) Prior Publication Data

US 2016/0007419 A1 Jan. 7, 2016

Related U.S. Application Data

(63) Continuation of application No. 13/756,282, filed on Jan. 31, 2013, now Pat. No. 9,133,990.

(51) Int. Cl.
*F21K 99/00* (2016.01)
*H05B 33/08* (2006.01)
(Continued)

(52) U.S. Cl.
CPC .......... *H05B 33/0845* (2013.01); *F21K 9/00* (2013.01); *F21K 99/00* (2013.01); *G02B 6/0068* (2013.01);
(Continued)

(58) Field of Classification Search
CPC ... H01L 33/50; H01L 33/504; H01L 25/0753; F21K 9/64; H05B 33/0863; F21V 9/00; G02B 6/0068
(Continued)

(56) References Cited

U.S. PATENT DOCUMENTS 8,044,427 B2 10/2011 Su et al.
2015/0002034 A1* 1/2015 van de Ven ........ H05B 33/0824
315/193

* cited by examiner

*Primary Examiner* — Douglas W Owens
*Assistant Examiner* — Laura Yesildag
(74) *Attorney, Agent, or Firm* — Vierra Magen Marcus LLP

(57) ABSTRACT

An LED array includes three or more strings of bare LEDs mounted in close proximity to each other on a substrate. The strings of LEDs emit light of one or more wavelengths of blue, indigo and/or violet light, with peak wavelengths that are less than 490 nm. Luminescent materials deposited on each of the LED chips in the array emit light of different wavelength ranges that are of longer wavelengths than and in response to light emissions from the LED chips. A control circuit applies currents to the strings of LEDs, causing the LEDs in the strings to emit light, which causes the luminescent materials to emit light. A user interface enables users to control the currents applied by the control circuit to the strings of LEDs to achieve a Correlated Color Temperature (CCT) value and hue that are desired by users, with CIE chromaticity coordinates that lie on, or near to the black body radiation curve. Preferably a transparent material is dispensed on the substrate between the LED semiconductor chips to substantially surround the LED semiconductor chips. Thereafter at least one layer containing luminescent materials is applied on the LED semiconductor chips and the transparent material.

7 Claims, 11 Drawing Sheets

(51) Int. Cl.
*F21V 8/00* (2006.01)
*H01L 33/50* (2010.01)
*F21K 9/00* (2016.01)
H01L 25/075 (2006.01)
F21V 29/67 (2015.01)
F21Y 105/12 (2016.01)
F21Y 105/10 (2016.01)
F21Y 115/10 (2016.01)
F21Y 113/13 (2016.01)

(52) U.S. Cl.
CPC ....... *H01L 33/504* (2013.01); *H05B 33/0863* (2013.01); *F21V 29/67* (2015.01); *F21Y 2105/10* (2016.08); *F21Y 2105/12* (2016.08); *F21Y 2113/13* (2016.08); *F21Y 2115/10* (2016.08); *H01L 25/0753* (2013.01); *H01L 2924/0002* (2013.01); *H01L 2933/0041* (2013.01)

(58) Field of Classification Search
USPC ................ 362/227, 230, 231, 600, 601, 602
See application file for complete search history.

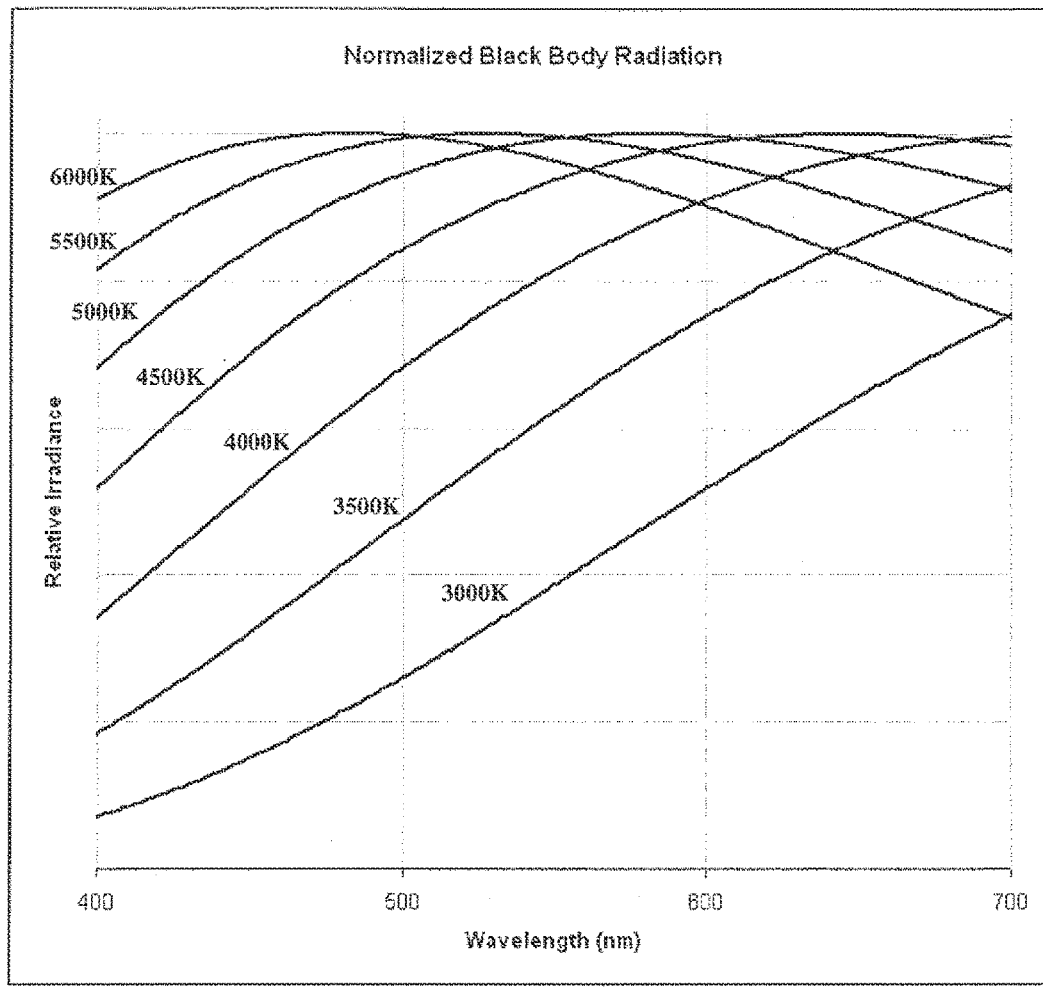
FIG. 1 – PRIOR ART

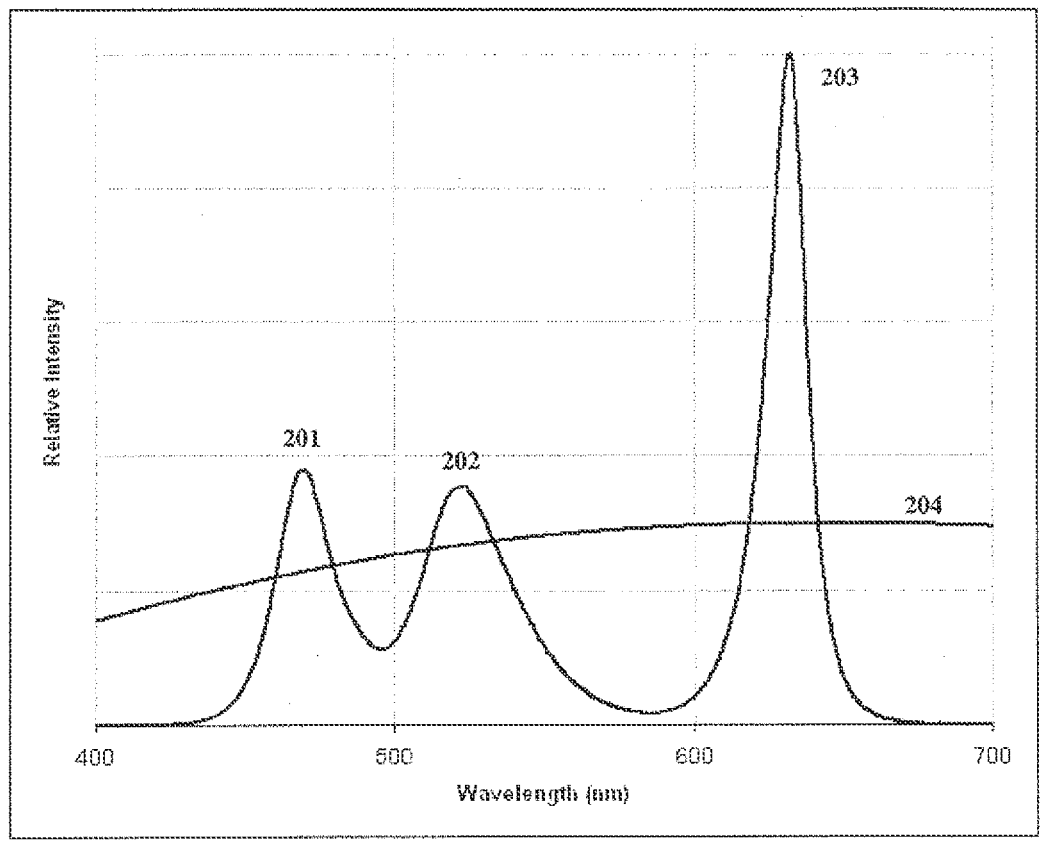
FIG. 2 – PRIOR ART
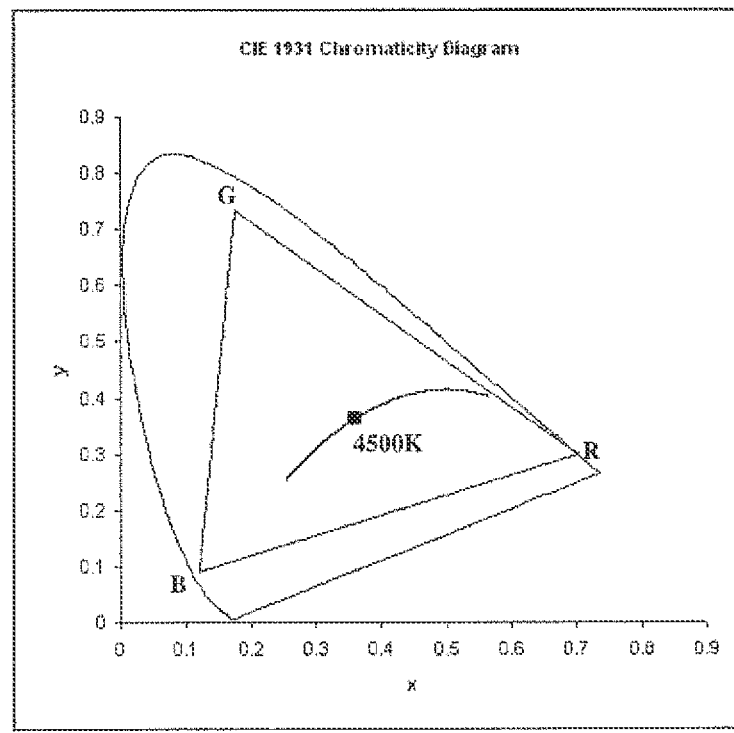
FIG. 3 – PRIOR ART

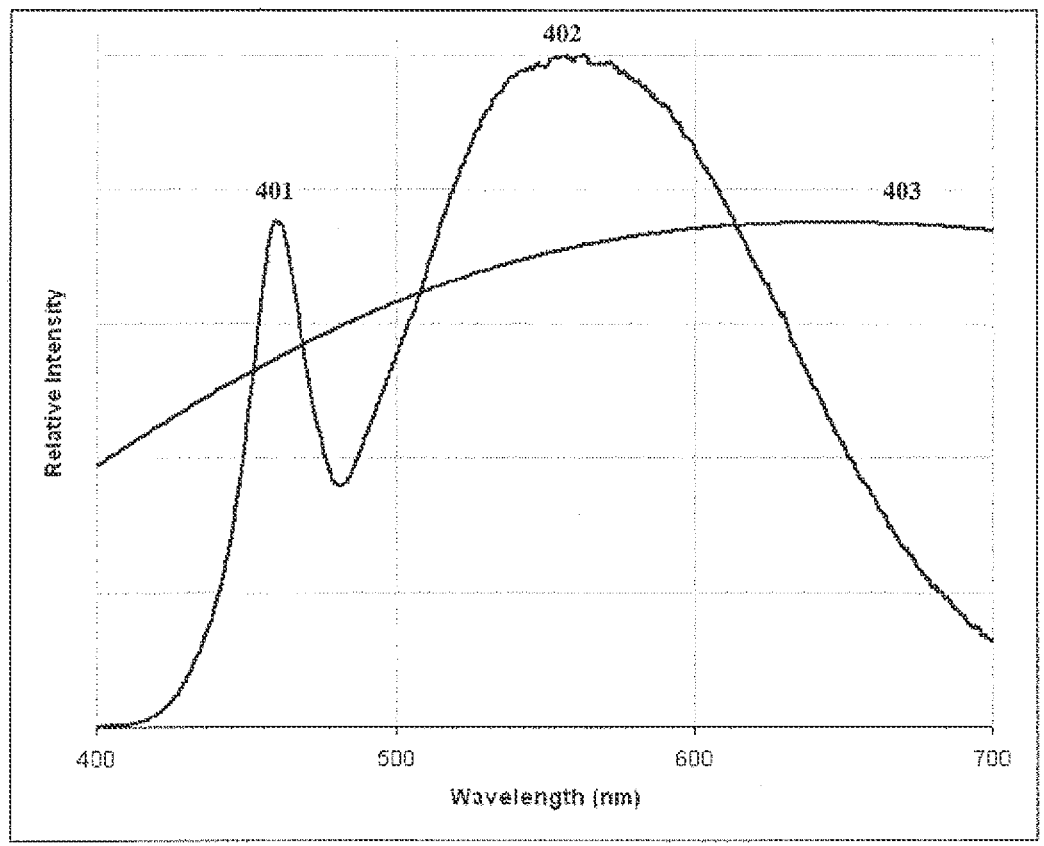
FIG. 4 – PRIOR ART

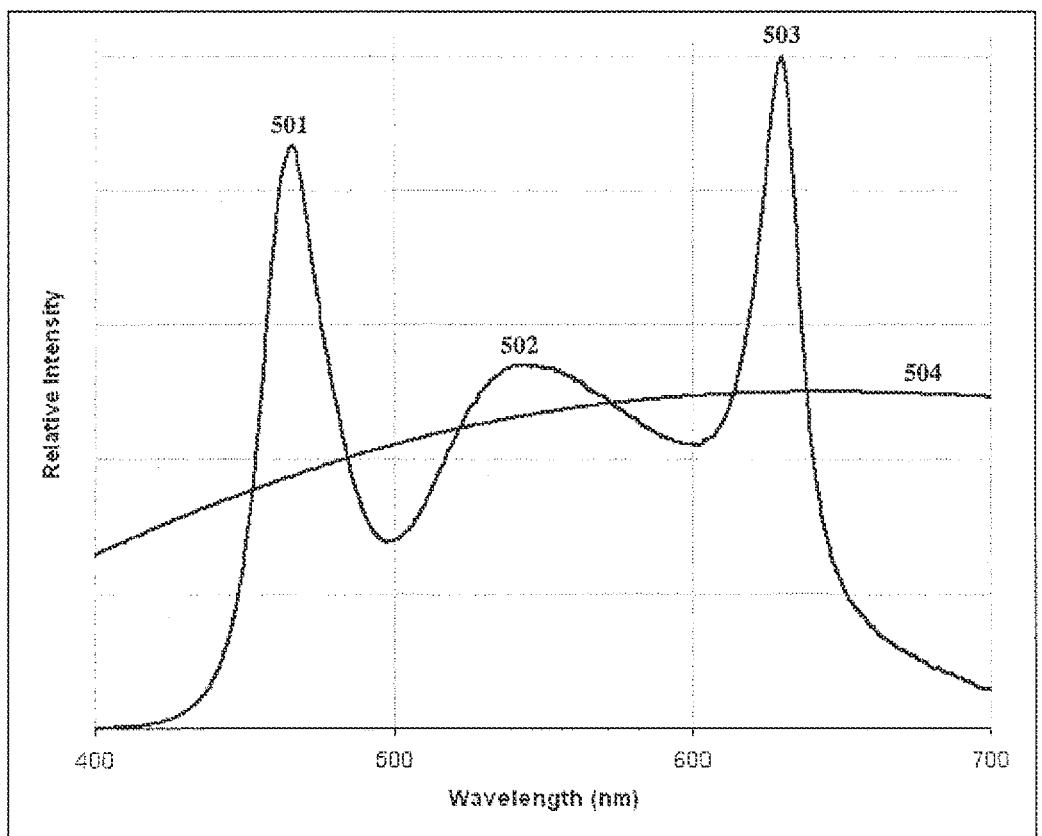
FIG. 5 – PRIOR ART

I = INDIGO LED (APPROX. 410 – 450 nm)
B = BLUE LED (APPROX. 450 – 490 nm)

P = PHOSPHOR TYPE
P1 = YELLOW
P2 = GREEN
P3 = RED

LED ILLUMINATOR APPARATUS, USING MULTIPLE LUMINESCENT MATERIALS DISPENSED ONTO AN ARRAY OF LEDS, FOR IMPROVED COLOR RENDERING, COLOR MIXING, AND COLOR TEMPERATURE CONTROL

CROSS-REFERENCED APPLICATION

This application is a continuation of U.S. application Ser. No. 13/756,282, now U.S. Pat. No. 9,133,990, filed Jan. 31, 2013, which application is herein incorporated in its entirety by this reference.

BACKGROUND

The present invention relates generally to electrical lamp fixtures used for general-purpose lighting, and specifically to an improved light emitting diode (LED) illumination apparatus, incorporating an LED array in which multiple phosphors have been dispensed onto the LEDs, in order to improve the color rendering, color mixing, and color temperature control of the apparatus.

In order for LED illuminators and light engines to act as a satisfactory replacement for traditional general-purpose lighting, it is desirable and even necessary to produce white light with characteristics that are similar to the light produced from an incandescent bulb, or in some case, to accurately replicate the light provided by natural sunlight. This is especially important for lighting applications that demand high quality light with well-controlled parameters, such as lighting for professional photography, videography, and the motion picture industry. In a general sense, this means that the LED illuminator or light engine should have a spectral response or characteristic that mimics the spectral response of an incandescent bulb, and/or natural sunlight, at specific color temperatures. The spectral characteristics of both the LED illuminator and the target light sources can be expressed in the form of a spectral plot of light emission as a function of wavelength, and also in terms of related measures including Correlated Color Temperature (CCT), hue (which can be quantified using CIE chromaticity diagram coordinates), and Color Rendering Index (CRI).

Briefly, the Correlated Color Temperature (CCT) of an illuminator or lamp is the color temperature of a black body radiator which to human color perception most closely matches the light from the lamp, and is typically expressed in degrees Kelvin (K). In practice it is primarily applicable to white light sources. A typical incandescent bulb will have a CCT in the range of 2500-3000K, typically referred to as "warm white". Illuminators with higher CCT values may be described as "cool white". Light from the sun may have CCT values in the 5000-6500K range, depending on time of day, the height of the sun above the horizon, and also the degree of overcast. It is a highly desirable attribute for an LED illuminator to have a well-defined and controlled color temperature, with CCT values ranging from approximately 2500K to 6500K or even higher, depending on the application. LED illuminators may also provide variable color temperature, either through a finite number of CCT settings, or via continuously varying control.

Color Rendering Index (CRI) provides a quantitative measure of a light source's ability to faithfully reproduce the colors of illuminated objects, in comparison to an ideal or natural light source. For the comparison to be valid, the test light source and the reference source must be of the same color temperature. For light sources above 5000K, daylight is used as the reference source. For light sources under 5000K, an ideal black body radiator of the same color temperature is used. A full description of the measurement of CRI is beyond the scope of this document. However, the basic measurement process consists of measuring the light reflected from a series of test color samples, when illuminated by the test light source and the reference light source. In practice, software packages that are provided with commercially available visible light spectrometers are able to compute the Color Rendering Index of light sources. In principle, natural sunlight will have a CRI of 100, and the light emitted by an ideal black body radiator will also have a CRI of 100.

It is also possible to specify or quantify the hue or color of light using CIE chromaticity diagram coordinates. The color coordinates of an ideal black body radiator, taken at different CCT values, are represented on a CIE chromaticity diagram as a curved line segment. However, it is important to note that the color coordinates of a light source do not provide any indication of the CRI of the light source.

LED illuminators that are intended to produce white light for general illumination purposes, face two significant challenges. They should provide light of the intended color temperature, generally in the range of 2500K to 6500K, depending on the desired appearance and application, with CIE chromaticity diagram color coordinates that lie on, or very close to, the black body radiation curve. What is meant by "very close to" will be explained below. They should also achieve a high CRI, as close to 100 as possible. This is especially important for demanding applications such as in the fields of professional photography, videography, and motion picture filming. By using a mix of red, green, and blue LEDs, it is easy to provide any desired color temperature. However, the color rendering of such an RGB LED illuminator will be very poor, with CRI values in the 70's, or even lower. This is due to the fact that the RGB LEDs have narrow bandwidth emission, with FWHM (full width at half maximum) bandwidths of only 25-30 nm, for each of the three LED colors/types. For example, test objects that reflect significant amounts of yellow wavelengths will not render accurately, due to an RGB LED illuminator's lack of emitted light in the yellow region. Even if amber LED chips are added, there is a "dead zone" that is roughly in the range of 550 to 590 nm in which LEDs have very low emission efficiency, making it extremely difficult to obtain CRI values above 92%, even when using a large number of LED wavelengths.

The most common method for obtaining good color rendering from an LED illuminator is to coat blue LEDs with phosphors that absorb light energy from the blue LEDs, and convert a portion of this energy into broad-spectrum emission at higher wavelengths, typically with a spectral peak in the yellow region of the visible light spectrum. In this document, higher wavelengths and longer wavelengths have identical meaning and are used interchangeably. Typical phosphors have FWHM bandwidths of approximately 50 to 120 nm, and therefore provide greater spectral fill than individual LEDs. This approach can provide reasonably good color rendering, with a fixed color temperature. However, it can be difficult to accurately control the color temperature that results, and it may also be difficult to achieve lower color temperatures, such as "warm white". For this reason, some prior art embodiments add red LEDs, as a means of "warming" the light output, and also potentially offering the ability to vary the color temperature of the illuminator. While the addition of red LED chips provides advantages in terms of color temperature control, the narrow spectral bandwidth of the added red LEDs has limited benefit in terms of color rendering, and in fact may actually reduce the CRI of the light output as the output of the red LEDs is increased. The CRI of such an illuminator is determined primarily by the spectral characteristics of the phosphor that is used to coat the blue LEDs.

Due to the limitations described above, there exists a need for an LED illuminator that provides the combined light output from a cluster or array of multiple LED chips, for applications that demand high-quality lighting. In addition to providing the usual advantages of LED lighting, in terms of energy efficiency, long life, and reliability, it desirably provides a well-controlled Correlated Color Temperature (CCT), preferably with the ability to vary the CCT over a wide range via some form of user control. It preferably also provides extremely good color rendering, with CRI values that exceed 95, and ideally achieve CRI values of 98 and above, throughout the illuminator's full range of CCT settings. Finally, the light from the LED illuminator is preferably highly uniform, in terms of color and hue, over its field of view.

SUMMARY OF THE INVENTION

According to one embodiment, an illumination apparatus comprises an LED array, where the array includes three or more strings of LEDs. The strings of LEDs emit light of one or more wavelengths of blue, indigo and/or violet light, with peak wavelengths that are less than 490 nm. The LED array comprises bare LED chips that are mounted in close proximity to each other on a substrate. Luminescent materials are deposited on each of the LED chips in the array. The materials emit light of different wavelength ranges that are of longer wavelengths than light emissions from the LED chips, in response to light emissions from the LED chips; A control circuit applies currents to the strings of LEDs, causing the LEDs in the strings to emit light, which causes the luminescent materials to emit light. A user interface enables users to control the currents applied by the control circuit to the strings of LEDs to achieve a Correlated Color Temperature (CCT) value and hue that are desired by users, with CIE chromaticity coordinates that lie on, or near to the black body radiation curve.

According to one embodiment, a method is described for making an illumination apparatus. An array of unpackaged LED chips mounted on a substrate is provided, the array including two or more strings of LED chips, wherein said strings of LEDs emit light of different wavelength ranges. A transparent material is dispensed on the substrate between the LED semiconductor chips to substantially surround the LED semiconductor chips. Thereafter at least one layer containing luminescent materials is applied on the LED semiconductor chips and the transparent material.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

FIG. 1 shows the spectral profiles of ideal black body radiators, at several Correlated Color Temperature (CCT) values.

FIG. 2 is a representation of the prior art, showing the spectral profile of a typical RGB LED illuminator.

FIG. 3 shows the corresponding CIE chromaticity diagram for the RGB LED illuminator of FIG. 2.

FIG. 4 is a representation of the prior art, showing the spectral profile of a typical LED illuminator using blue LEDs that are coated with a phosphor to produce white light.

FIG. 5 is a representation of the prior art, showing the spectral profile of an LED illuminator that uses blue LEDs that are coated with a phosphor, with the addition of red LED chips to provide either a warmer white light, or potentially the ability to adjust the color temperature of the light.

DETAILED DESCRIPTIONS OF THE PREFERRED EMBODIMENTS

Figure 6A:
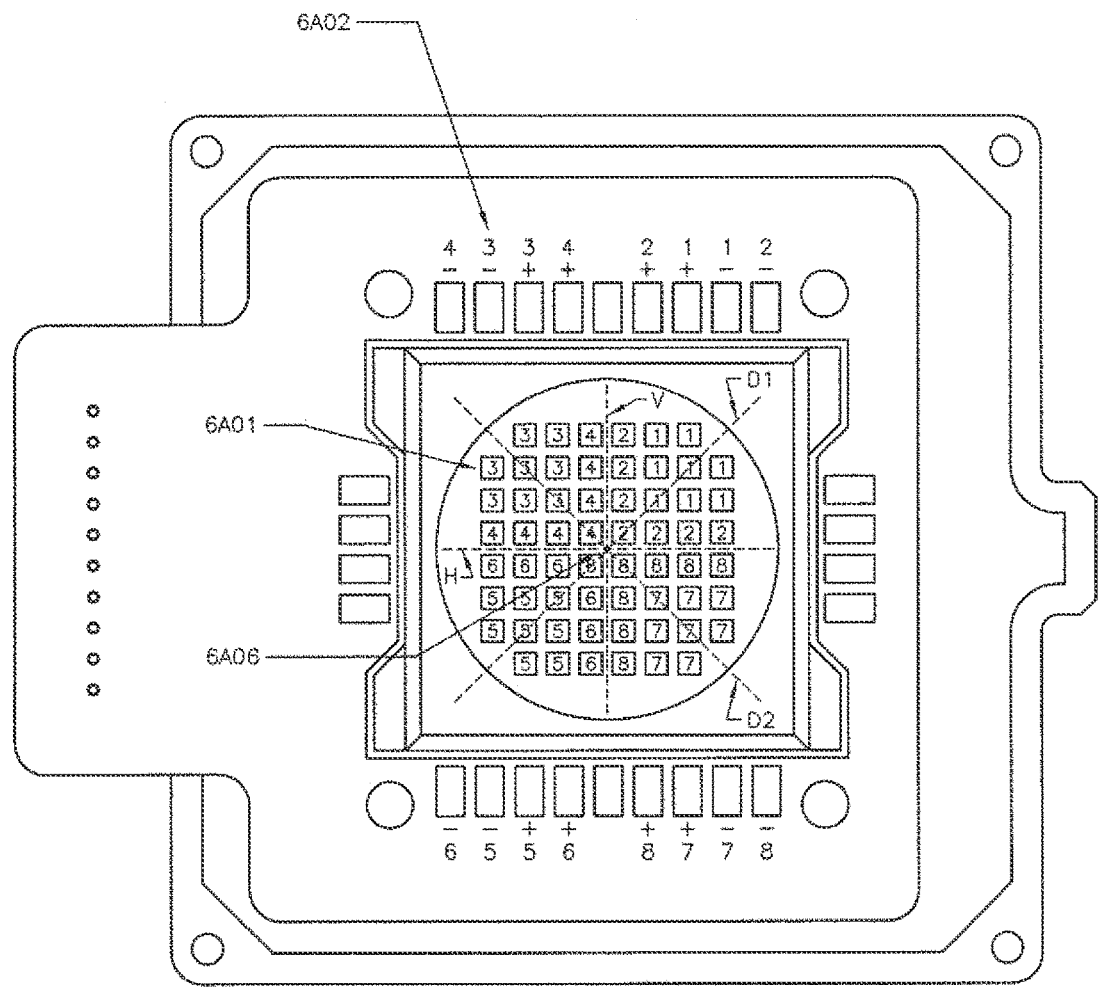
FIGS. 6A and 6B show two views of one embodiment of an LED array of the present invention, showing the use of multiple LED chips with multiple phosphor types, configured as multiple channels or strings of LEDs.

The Color Rendering Index (CRI) of a light source provides a quantitative measure of the quality of the light provided by the source, in terms of its ability to accurately render the colors and appearance of illuminated objects. High CRI values, approaching the ideal of 100, are important for light sources used in such demanding applications as professional photography, videography, and in the motion picture industry. Additionally, the Correlated Color Temperature (CCT) and hue of the light source are tightly controlled, preferably with the ability to adjust or vary the CCT of the light source.

FIG. 1 shows spectral plots of an ideal black body radiator over the approximate range of visible light, with a wavelength range of 400 nm to 700 nm, at a variety of color temperatures. As can be seen from the plots, the spectral response of an ideal black body radiator is a function of its CCT. Without getting into the mathematics of CRI calculation, a light source of a given CCT will achieve very high CRI if its spectral response closely matches that of an ideal black body radiator at that same CCT. Therefore, the plots shown in FIG. 1 can be viewed as objective or target spectral response curves for high quality light sources, at a variety of CCT values.

By blending or mixing the light output of red, green, and blue LEDs, it is possible to create light of almost any visible color or hue, including white light at a wide variety of CCT values, thereby mimicking the appearance of black body radiators at the same CCT value. FIG. 2 shows a representative spectral plot of a prior art RGB LED light source with CCT of 4500K, showing the three narrow-band spectral peaks provided by the blue (201), green (202), and red (203) LEDs, respectively.

The CIE chromaticity diagram shown in FIG. 3 shows the color coordinates of this RGB LED light source, showing that they fall on the ideal blackbody radiator curve. The triangle within the diagram represents the full color or hue gamut that is possible with the RGB LED light source. The curved line that runs in the middle of the chart represents the ideal blackbody radiator curve, and the dot represents the CIE coordinates of an ideal blackbody radiator with CCT of 4500K. By appropriately proportioning the output of the RGB LEDs, the light output can be placed anywhere within the triangle represented by the three independent red, green, and blue light sources, and also at any CCT value along the black body curve. As such, the perceived hue or color of the light, when viewed directly, will also match the hue or color of an ideal black body radiator of the same CCT value.

However, this RGB LED light source will provide very poor color rendering. Qualitatively, in comparing the spectral plot of FIG. 2 with the plot of an ideal black body radiator of the same 4500K CCT (204), it can be seen that the spectral profile of the RGB LED illuminator has many deep gaps or voids in its spectrum, as well as spectral peaks. This results in a low CRI value. Conversely, high quality light with high CRI can be achieved by smoothing out the spectral profile, including filling in the gaps in the spectrum, as well as attenuating any sharp peaks in output.

A common method for providing an LED light source with moderately good CRI (above 80, for example) is to use blue LED chips that have been coated with phosphors. Excitation of the phosphor material by the blue LEDs induces Stokes shift in the emission of light from the phosphor, resulting in an emission wavelength range that is at higher wavelengths than the excitation wavelength. The Stokes shift can range from a few tens of nanometers, to as much as 200 nm or more. In LED illuminators, the excitation wavelength is typically in the range of 410 nm to 490 nm (with perceived colors ranging from violet or indigo to blue). Depending on the phosphor material used, the major emission wavelength range may be in the green, yellow, or red portions of the visible light spectrum. Said phosphor formulations are commercially available, and are designed to absorb energy at particular lower or shorter wavelengths (such as are emitted by blue LEDs), and to emit light at higher or longer wavelengths. The emissions from said phosphors have a much wider spectral bandwidth, typically with FWHM values of 50-120 nm, versus only 25-30 nm for typical LEDs. Replacing green and red LEDs, each with narrow emission bandwidth, with green, yellow, and/or red phosphors with much wider emission bandwidth, creates an overall emission spectrum that provides much higher CRI. Commercially available phosphors are typically available in the form of small particles or powders, with typical materials being silicates, aluminates, garnets, and nitrides, with various attributes of emission wavelength range, efficiency, lifetime, etc. The phosphor material(s) are typically mixed into some form of silicone gel or epoxy, and then applied to the top surface of the LED chip(s).

FIG. 4 shows a plot of a prior art LED illuminator, showing the direct spectral output from blue LEDs (401), as well as the broader spectral output from the applied phosphors, primarily in the yellow region of the spectrum (402). With appropriately chosen phosphor materials and proper application of the phosphor materials to the LEDs, this prior art light source can be designed to have the same 4500K CCT value as the prior art RGB LED light source of FIG. 2. Therefore, its CIE chromaticity diagram will be essentially the same as the one shown in FIG. 3. However, its spectral plot comes closer to matching the plot of an ideal black body radiator at the same 4500K CCT (403), with fewer deep gaps or voids in the spectral plot, and therefore its CRI is substantially higher. Prior art LED illuminators using phosphors can achieve CRI values in the 80's, and sometimes in the low 90's.

Although the CCT (and hue) of an LED illuminator using blue LEDs and phosphors can be controlled by appropriately engineering the type of phosphor material used, and the thickness and density of its application on top of the blue LEDs, it is difficult to achieve precise control. It is also difficult to design such a light source with adjustable or variable CCT. One prior art method for providing both tighter control of CCT, as well as adjustability or variable CCT, is to add in a quantity of red LED chips, possibly with separate control of their drive current. By varying the proportioning of the light output from the blue LEDs with phosphors, and the red LEDs, it is possible to adjust the CCT of the combined light output. FIG. 5 shows the spectral plot of such a configuration, showing the blue LED peak (501), the broader spectral profile of the phosphor emission (502), and the red LED peak (503), also compared to the spectral plot of an ideal black body radiator of the same 4500K CCT (504). The CIE chromaticity diagram for this prior art light source will also be essentially the same as the one shown in FIG. 3, with coordinates that lie on the ideal black body radiator curve. By varying the output of the red LEDs, the coordinates will move to other CCT values along the curve. Although the addition of some red LEDs may slightly improve the CRI value of the illuminator, it may also lead to excessive peaks in the red portion of the spectrum, resulting in worse CRI values at lower CCTs (which require increased red LED output). In addition, the spatial positioning of the red LED chips within the light source can lead to "hot spots" of red light within the field of view, contributing to poor color/hue uniformity. It is also true that precise control of the phosphor application is still required, in order to achieve CIE chromaticity diagram color coordinates that along, or close to, the black body radiation curve.

Each hue or color of light has a coordinated point (x, y) in the CIE chromaticity diagram, as shown in FIG. 3. The black body radiation curve is a well defined curve in the diagram. While it is desirable for hue of the illumination light to be on the black body radiation curve in the diagram, for some lighting applications, it is adequate for the hue of the illumination light to be close to or near the black body radiation curve, such as where the "near" or "close to" hue is defined as points whose x and y color coordinates are both within +\-0.006 of the x and y coordinates of a point lying on the black body radiation curve, with the desired or intended CCT value. Such and other variations are within the scope of the invention.

The present invention seeks to achieve very high CRI values, while also providing well-controlled and adjustable/variable CCT and hue, with excellent color mixing and uniformity. This is achieved by using one or multiple wavelengths of blue (and/or violet or indigo) LEDs. In other words, where LEDs emitting light of multiple different wavelength ranges are used, the wavelength ranges may be in one or more of the blue, violet and indigo portion of the spectrum. All of the LEDs are coated with multiple types of phosphors having differing spectral profiles for their emissions. The peak wavelengths of the LEDs that serve as the excitation source for the phosphor emissions, are at 490 nm and below. The phosphor emissions will typically be at wavelengths that are 20-250 nm higher or longer than the excitation wavelength. Further, by having independent control of the drive current for different subsets of the LED chips and their respective phosphor types, the CCT of the light source can be easily adjusted or varied.

In addition to using traditional phosphor materials, it is also possible to use other types of luminescent material, including quantum dots. The key attribute of quantum dots is that their emission spectra are a function not only of the material from which they are made, but also of the size of the quantum dot particles. With appropriate selection of quantum dot materials, as well as the size range of the quantum dots, different emission spectral profiles can be obtained. Similar to traditional phosphor materials, quantum dots are excited by illuminating them with shorter wavelength light. As with traditional phosphor materials, quantum dots with a variety of excitation wavelengths and emissions spectra are commercially available. One key difference between quantum dots and traditional phosphor materials, however, is that quantum dots are commercially available with emission spectra in the blue range of visible light, as well as in the green, yellow, and red ranges. That difference notwithstanding, wherever phosphors are mentioned in the description of the present invention, it is also possible to substitute quantum dots for the phosphor material.

In one embodiment of the invention, a compact illuminating apparatus comprises an LED array with accompanying optical elements that outputs intense, broad-spectrum light uniformly over a field of view. The LED array contains multiple strings, each comprising several LED chips of potentially different wavelengths, with each string controlled electronically as a separate channel. The LED chips are of wavelengths that are able to excite emissions from commercially-available phosphor materials. Phosphors of multiple types and emissions spectra are dispensed or applied on top of all of the individual LED chips, such that it is possible to have a different phosphor type on each individual LED chip, or on different subsets of the LED chips. In addition to the use of traditional phosphor materials, it is also possible to use other materials with luminescent properties, such as quantum dots. The multiple channels allow for each string of LEDs and hence their output color and power to be independently switched on/off and varied in intensity, respectively. This allows the LED illuminator to provide variable or adjustable color temperature (CCT), while maintaining extremely high CRI. The pattern of LED wavelengths and different phosphor types (or other luminescent materials) and emissions spectra is configured for high color uniformity. The optical elements immediately succeeding the LED array serve to collect and reshape the output light to enhance both light coupling efficiency and uniformity. A lens attached to the surface of the LED array enhances light extraction, and secondary optics including reflectors, additional lenses, and/or diffusers may be used to further shape the beam, and to further improve the homogeneity and uniformity of the beam, both in terms of light output and color.

In another embodiment of the invention, a method for achieving high phosphor excitation efficiency is also introduced. A transparent material with high index of refraction, such as a silicone gel, is used to fill around the edges of the multiple LED chips, to increase the escape of light from the sides of the LED chips' "slab" shape. Silicone gel containing potentially differing phosphor types is then applied on top of each chip, in such a way that there are no gaps or voids in the overall coverage of the LED chips by phosphor-containing gel. Different phosphor types may be dispensed on different subsets of the LED chips in the LED array. This process may also be used with other luminescent materials, such as quantum dots. The above embodiments are described in detail below.

Figure 6B:
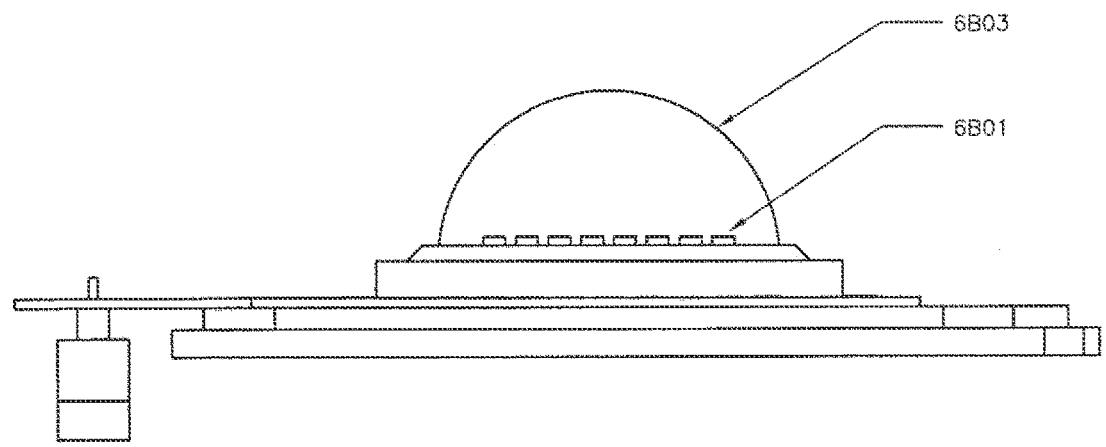

FIGS. 6A and 6B show front and side views, respectively, of one possible embodiment of an LED array of the present invention. The LED array comprises a multiplicity of individual LED chips (6A01 and 6B01). The LED array embodiment depicted in FIGS. 6A and 6B contains 60 LED chips, although in other embodiments the number of LED chips may be as small as 4, or in excess of 100. The individual LED chips of the embodiment shown in FIGS. 6A and 6B are approximately 1 mm×1 mm in size. However, LED chips of other dimensions may also be used, and the diameter of the light-emitting area is therefore a function of the number of LED chips, the individual chip dimensions, and the spacing between LED chips. In FIG. 6A, the LED chips are shown as element (6A01), with each small square representing an individual LED chip. The diameter of the light-emitting area of the array is approximately 5-25 mm, depending on the number of LED chips in the array, as well as the individual chip size and spacing, thereby allowing the LED array to function as an "extended point source". Note that the single lens that is placed over the light-emitting area of the LED array (6B03) may have a diameter that is slightly larger than the actual light-emitting area, such as a diameter of about 6-30 mm.

The LED chips within each array are connected electrically into multiple channels, each channel consisting of at least one LED chip, or a series string of multiple LED chips. An LED string or channel is controlled as a single entity, with all LED chips within the series string having an identical electrical current passing through them, and therefore each chip within a string will produce light of similar brightness. Separate electrical connections or connectors (6A02) are provided for each LED string within the array, either in the form of electrical pins, or as electrical pads, as shown in the figure, so that the relative brightness of the different strings can be controlled and varied independently of one another. The embodiment shown in FIGS. 6A and 6B comprises eight channels or strings of LED chips, with the channel number shown within each LED chip (6A01), and also adjacent to the electrical connections (6A02). Note that the number of channels may vary, as described in more detail below. Also, channels may be electrically connected to each other, external to the array, if fewer separately-controllable channels are required. For example, although the embodiment shown in FIGS. 6A and 6B comprises eight channels of LED chips, the driver circuit for the embodiment might comprise four driver circuits, each of which is driving two LED strings. Typically, the multiple LED channels that are to be driven by a single driver circuit would be connected in series, such that the drive current in the combined channel would be constant. The LED array shown in FIGS. 6A and 6B also incorporates one or more internally-mounted thermistor chips, which are brought out to some of the unlabeled electrical connections, for the purposes of monitoring array temperature.

Thermal management is a key element of the design of the present invention, in order to extract the heat that is generated by the large number of LED chips that are packaged closely together in the LED array. The LED array incorporates a metal circuit board (MCB) which provides for the routing of conductive traces to each of the LED strings, while at the same time providing electrical isolation between LED strings. The MCB also provides for high thermal conductivity, to extract heat from the densely-packed LED chips. The MCB LED array substrate, having the thermal conductivity of metal, conducts the heat from the LEDs to the base of the MCB substrate, which is mounted onto a heat spreader or heat sink. The MCB of the present invention is described in more detail in U.S. Pat. No. 8,044,427, issued on Oct. 25, 2011, entitled "LIGHT EMITTING DIODE SUBMOUNT WITH HIGH THERMAL CONDUCTIVITY FOR HIGH POWER OPERATION".

In most embodiments of the present invention, the LEDs within a string would be of similar wavelengths. However, different strings might contain LEDs of varying wavelengths. In one embodiment of the LED array, some strings would consist of different wavelengths of blue, indigo and/or violet light, with peak wavelengths that are less than 490 nm. Similarly, an individual LED string or channel might use just a single phosphor type, or it might use multiple phosphor types. Note that in all cases, all of the LED chips of the array are coated by one or more phosphor types, with different individual LED chips, even adjacent chips, having potentially different phosphor types coated onto them. The application process for applying phosphor materials to the LED chips allows for a differing, or even a unique phosphor formulation, to be applied at each one of the multiple LED chip sites. The phosphor formulation on any given chip may consist of a single type of phosphor material, mixed into a silicone gel material, or a blend of multiple types of phosphor materials mixed into the gel, for an even broader spectrum. By separately controlling the electrical current flowing through different LED strings, the relative proportions of light of different spectral characteristics can be varied. Within a particular string, it is still possible to use individual LED chips of multiple wavelengths, although the intensity of the light emission of the LED chips within a string will be of the same order of magnitude. In one embodiment of the present invention, multiple wavelength ranges of blue and indigo light (for example, LED chips with peak wavelengths at approximately 430 nm and 455 nm) could be used, in order to achieve broader coverage of the blue portion of the spectrum, as well as optimal excitation of specific phosphor types. Similarly, multiple wavelength ranges of phosphors, such as predominantly green, yellow, and red-emitting phosphors could be used either within a string, or in multiple strings, in order to achieve broader coverage of the green, yellow and red portions of the spectrum.

Figure 7B:
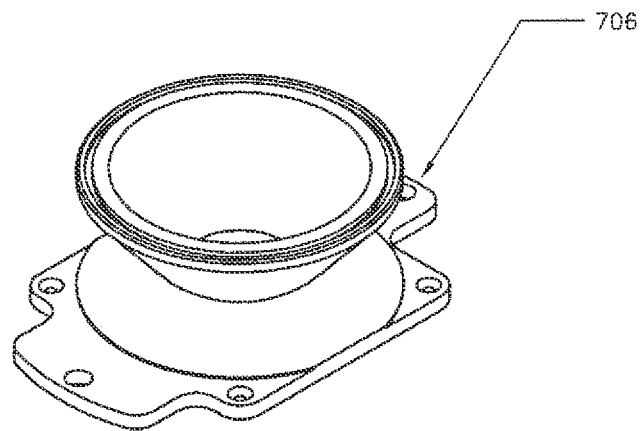
FIGS. 7A and 7B are a representation of one embodiment of the present invention using an array of LEDs with applied phosphors, showing an exploded view of the illuminator apparatus, without outer housing.
Figure 7A:
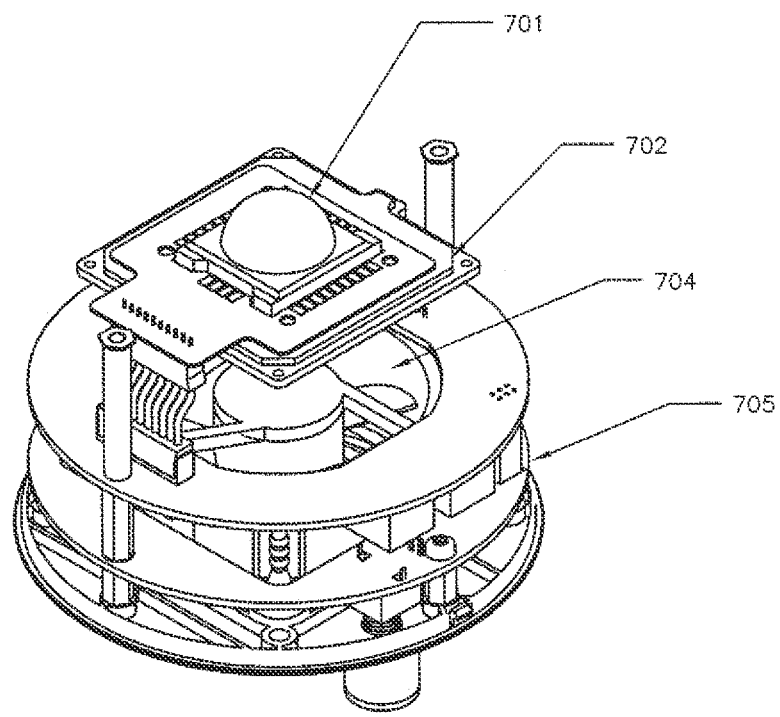
Figure 8:
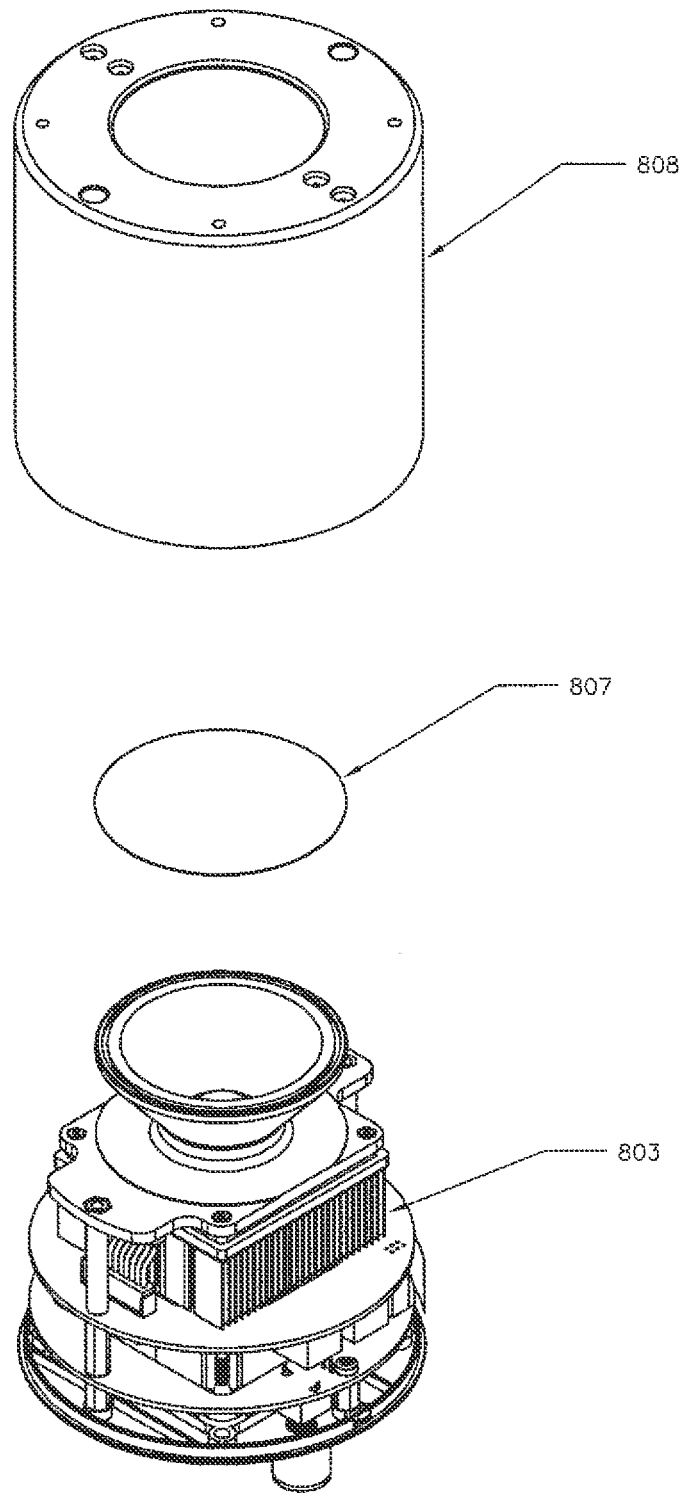
FIG. 8 is a representation of one embodiment of the present invention, showing additional details of the illuminator apparatus.

FIGS. 7A and 7B show one embodiment of the LED illuminator of the present invention, showing an exploded view of most of the illuminator apparatus, without its outer housing. FIGS. 7A, 7B and FIG. 8 represent just one of the possible form factors for an illuminator apparatus of the present invention. In FIG. 7A, the LED array (701) is mounted onto a heat spreader (702). As discussed above, the Metal Circuit Board (MCB) of the LED array provides for efficient heat transfer from the LED chips, to the heat spreader. In most embodiments of the illuminating apparatus, a heat sink of some kind will be mounted underneath the heat spreader (702). The heat sink of this embodiment is omitted from FIG. 7A, to show that in this embodiment there is a fan (704) underneath. (The heat sink is shown in FIG. 8.) Beneath the fan (704) is a printed circuit board or PCB (705) containing the control and drive electronics for the apparatus. In order to shape the light output of the LED array, secondary optics may be designed into the illuminating apparatus. In the embodiment shown in FIG. 7B, beam shaping is provided by a reflector (706). More elaborate optics, including additional lenses, apertures, shutters, zooming mechanisms, etc., may also be used.

FIG. 8 shows additional details of the illuminator apparatus, representing one embodiment of the present invention. The heat sink (803) is shown mounted between the heat spreader and fan that were shown in FIG. 7A. In order to provide even better color-mixing, uniformity, and homogeneity of the light output, a diffuser element (807) may be included. One embodiment of a simple outer housing (808) is shown, without design features.

Although not shown in any of the figures, a complete illuminator apparatus will have one or more control knobs or other forms of user control(s). In one embodiment, one knob might be used to control overall brightness of the illuminator apparatus, with a second knob being used to control CCT. Other functional assignments of control knobs are also possible, such as having one knob control the brightness of a "warm white" light output of low CCT (such as 2500K), while a second knob controls the brightness of a "daylight" light output of higher CCT (such as 6500K). Varying the settings of the two control knobs would thus create a light output with CCT that is somewhere in the range of 2500K to 6500K. Other control implementations are within the scope of the present invention.

Figure 9A:
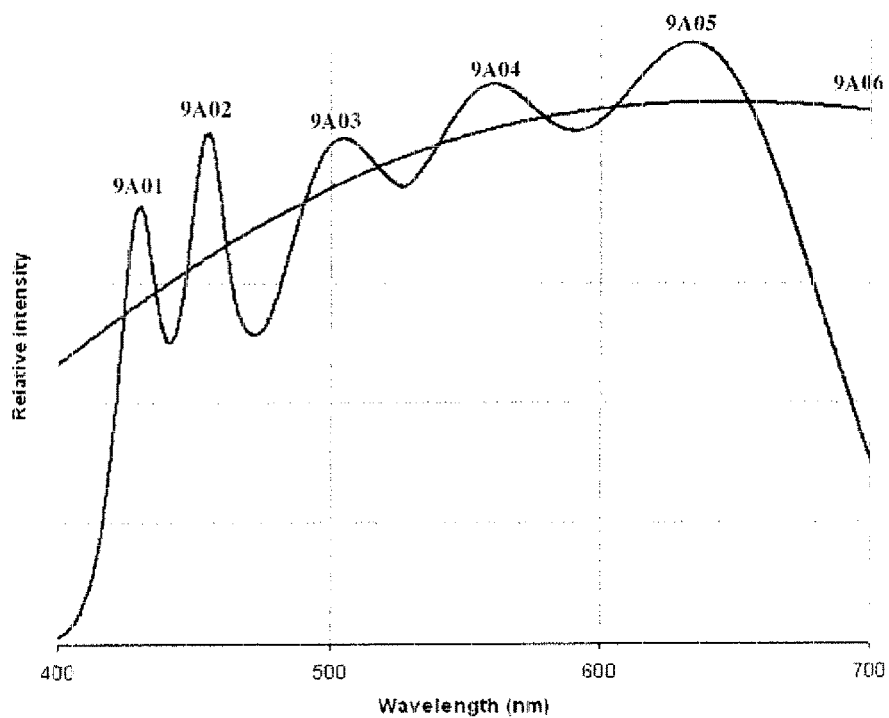
FIG. 9A is a representation of the spectral profile of one embodiment of the present invention, illustrating a spectral profile with very high CRI.

FIG. 9A shows a spectral plot of one embodiment of the present invention, based on the LED array embodiment depicted in FIGS. 6 and 10. The LED array of this embodiment comprises two wavelengths of indigo and blue LEDs, with spectral peaks at approximately 430 nm (9A01) and 455 nm (9A02), respectively. The LED chips of this embodiment are coated with three types of phosphors, that absorb energy from either or both of the blue LED chip types, and emit broad spectrum light with emissions that are roughly in the green (9A03), yellow (9A04), and red (9A05) portions of the visible spectrum. It should be noted that all of the LED chips of this embodiment are coated with at least one of the phosphor types. Applying a mixture of phosphor types onto a given LED chip, or set of LED chips, will result in a broader spectral output from those particular chip location(s), potentially improving the color and hue uniformity within the field of view of the illuminator. As noted previously, the application process for the phosphors allows differing phosphor types or mixtures of phosphor types to be applied at differing LED chip sites, even to the extreme of having a unique phosphor mixture for every LED chip (that is, the phosphor mixture on top of or above each LED being unique and different from the phosphor mixture on top of or above any other LED). Although the embodiment depicted in FIGS. 9A and 9B uses two wavelengths of indigo and blue LEDs, other embodiments might use just a single wavelength of blue, indigo, or violet LED, or more than two wavelengths. Similarly, the number of phosphor types may be less than, or more than, three.

As shown in FIG. 9A, the combined spectral output of the blue LED wavelength(s), and the multiple phosphor types, results in a spectral plot that stays close to that of an ideal black body radiator (9A06), with both good spectral fill (i.e., without deep gaps in the spectrum), and also the avoidance of spectral "hot spots", due to excessive output at specific wavelengths. The fact that all of the LED chips of this embodiment are coated in phosphor, significantly reduces the potentially excessive light output at specific narrow wavelength ranges and thus avoids spectral "hot spots" at such narrow wavelength ranges, that would result from having uncoated LED chips. Also, the use of multiple wavelengths of blue (or multiple wavelengths of blue, indigo and/or violet) LED chips, all of which serve to excite emissions from all of the phosphor types used, also serves to avoid excess light output at specific narrow wavelength ranges, in comparison to simply using a single wavelength of blue LED chip. The CRI of the present invention easily and routinely exceeds 95. Through careful selection of the phosphor types, as well as careful control of the application process, CRI values as high as 99 are achievable.

Figure 9B:
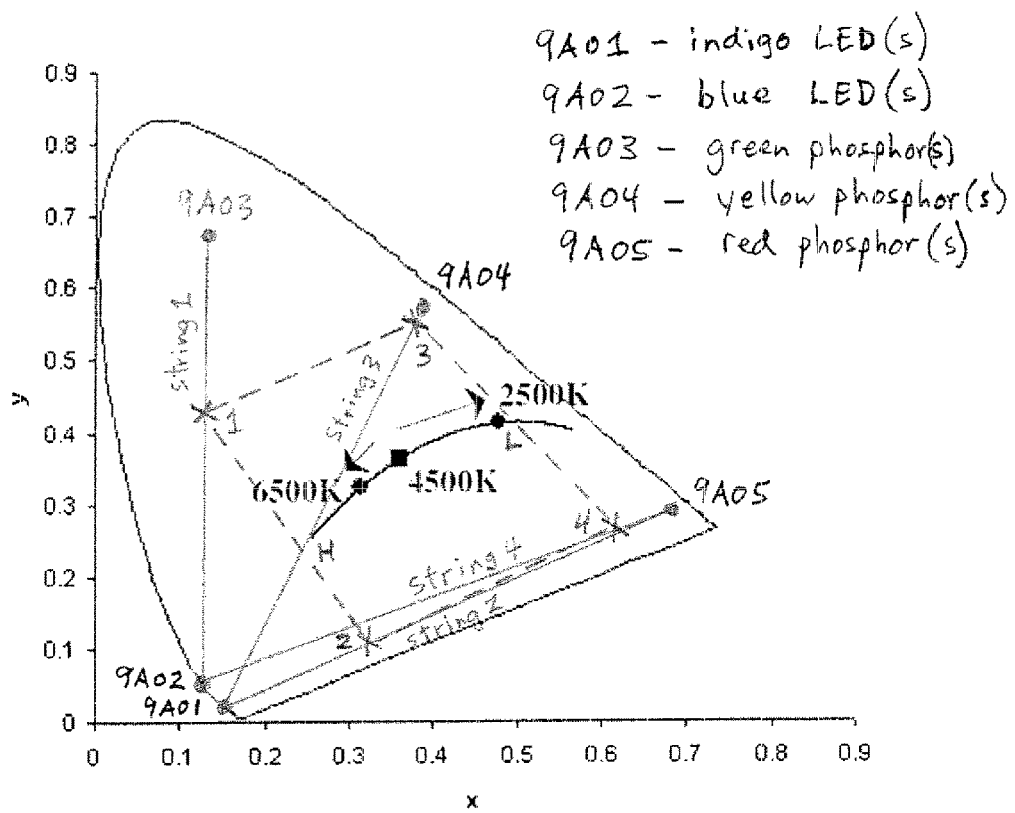
FIG. 9B shows the corresponding CIE chromaticity diagram for this illuminator.

The embodiment of LED array whose spectral plot is shown in FIG. 9A may be of either fixed, or adjustable CCT, although the plot of FIG. 9A shows a representative CCT of 4500K. The CIE chromaticity diagram of FIG. 9B shows that this embodiment of the present invention also has coordinates that lie on the ideal black body radiator curve, at differing possible CCT values.

In order to for the embodiment of LED array to have adjustable CCT, while maintaining CIE chromaticity diagram color coordinates that lie on or close to the ideal black body radiator curve for all of its intended CCT values, the array is designed such that its constituent LED strings (or groups of LED strings) are separately controllable. Each separately controllable LED string or group of strings will have its own color coordinates, that may be plotted onto the CIE chromaticity diagram. By controlling the relative brightness of the multiple LED strings (or groups of strings), any color or hue whose coordinates lie within the bounds of the individual strings' color coordinates can be achieved. For example, if there are three separately controlled LED strings, each with its own blend of applied phosphors and its own CCT value and different respective CIE chromaticity diagram color coordinates, then any desired CCT value and color or hue can be created, such that the resulting color coordinates lie within the triangle that is formed by the respective color coordinates of the three strings. This is similar in concept to the creation of multiple colors that fall within the "color triangle" of an RGB LED array, except that in the present invention the individual strings have color coordinates that lie fairly close to the ideal black body radiator curve to begin with, and therefore would tend to have the visual appearance of varying shades or hues of generally white light. Thus, if the three LED strings of this embodiment of the present invention are plotted onto the CIE chromaticity diagram, the resulting triangle will be relatively small (in comparison to an RGB LED array's color triangle), and will be centered on the ideal black body radiator curve.

In another embodiment of the present invention, four or more separately controllable LED strings (with applied phosphors) are used. These strings are configured such that their respective CIE chromaticity diagram color coordinates form a rectangle or parallelogram that straddles a section of the ideal black body radiator curve. Specifically, one string has color coordinates that fall somewhat above the high-CCT end of the ideal black body radiator curve (the "upper left" corner of the rectangle or parallelogram). The second string has color coordinates that fall somewhat below the high-CCT end of the ideal black body radiator curve (the "lower left" corner of the rectangle or parallelogram). Similarly, the third and fourth strings have color coordinates that bracket the low-CCT end of the ideal black body radiator curve. By varying the relative intensity or brightness of the four strings, the coordinates of the resulting light can be placed at any desired CCT value on the ideal black body radiator curve that falls within the rectangle or parallelogram.

In practice, the color coordinates of any individual LED string will have some variability. By spacing the color coordinates of the multiple LED strings far enough apart (in terms of their respective positions on the CIE chromaticity diagram), the variability of the individual strings can be corrected by carefully balancing the relative intensity or brightness of the multiple LED strings. In order for the CRI value of the resulting combined light to be high, in excess of 95, the CRI of the individual LED strings needs to be high as well. However, in as much as the individual LED strings have differing spectral profiles, the CRI value of the combined light output will in general be higher than the CRI values of the individual LED strings.

Although the dimensions of the light-emitting area of the LED array of the present invention is small, it still has finite area. Since the LED array comprises LED chips of multiple wavelengths, coated with phosphors of multiple wavelength ranges, differing colors of light output from different areas of the array surface may still cause non-uniformity in the color and hue of the resulting output light spot, or beam. In order to achieve good color/hue uniformity and homogeneity of its light output within the illuminated area, the LED array of the present invention is configured so that the various types of LED chips and phosphors are dispersed over the area of the array, such that the different types of LED chips and phosphors are intermingled with each other. In addition, the array is configured to be symmetrical around several axes. This symmetry, when combined with the effects of secondary optics such as a diffuser, light pipe, and/or a corrugated or textured reflector, serves to increase the spatial uniformity of the beam, in terms of its color and hue.

Figure 10A:
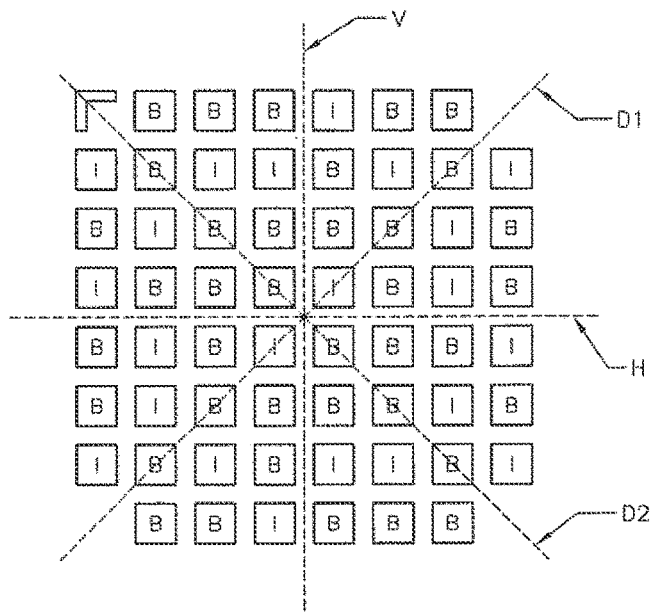
FIGS. 10A and 10B are representations of one embodiment of an LED array of the present invention, showing a geometric configuration of two wavelengths of LED chips and three phosphor types, respectively, that provides for good color mixing and uniformity of the beam.
Figure 10B:
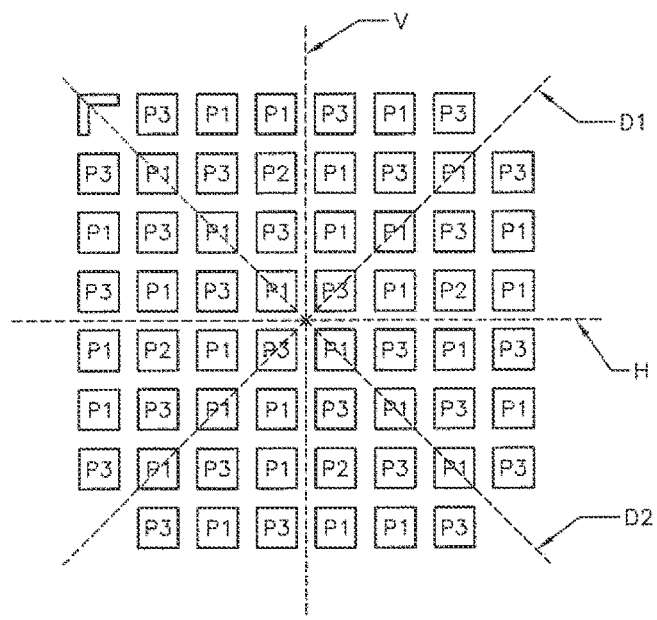

FIGS. 10A and 10B show one embodiment of the LED array of the present invention, using two wavelengths of blue and indigo LED chips, coated with three types of phosphors, and therefore similar in configuration to the embodiment whose spectral plot was depicted in FIG. 9A. FIG. 10A shows the arrangement of two wavelengths of LED chips, designated as "blue" for LED chips with a spectral peak within an approximate wavelength range of 450-490 nm, and as "indigo" for LED chips with a spectral peak within an approximate wavelength range of 410-450 nm. The specific wavelengths used may vary, but in one embodiment the "blue" LED chips would have a spectral peak at approximately 455 nm, and the "indigo" LED chips would have a spectral peak at approximately 430 nm. Note that the "blue" and "indigo" chip locations are intermixed, and that there is four-fold symmetry around the four axes of symmetry shown in the figure. In other words, for each LED chip type or each peak wavelength emitted by the LEDs, there are equal quantities of that chip type or LEDs emitting light of such peak wavelength on both sides of each of the four axes of symmetry, including the vertical axis V, the horizontal axis H, and both diagonals D1, D2 of the LED array. The four-fold symmetry of the LED chips and of the phosphor types described below, is defined as having equal quantities of that chip or phosphor type on both sides of each of the four axes of symmetry, including the vertical axis V, the horizontal axis H, and both diagonals D1, D2 of the LED array. In other words, the LED chip type (or LED emitting such peak wavelength) and phosphor type do not need to be mirror images across the four axes. Similarly, FIG. 10B shows the arrangement of three phosphor types, one of which is applied to the top of each of the LED chips. The number of phosphor types may be greater than or less than three, but in one embodiment, the three phosphor types P1, P2, and P3 would have spectral emissions that would be generally in the yellow, green, and red portions of the visible light spectrum, respectively. Note that the chip locations of the phosphor types are intermixed, and that there is also four-fold symmetry of the phosphor configuration. In this embodiment, all of the phosphor types are excited by either of the LED chip types. This LED chip and phosphor configuration provides excellent light mixing in terms of uniformity and homogeneity, which may be further augmented by the incorporation of a diffuser element or other secondary optics within the overall optical design of the LED illuminator.

Referring back to the embodiment of the present invention shown in FIG. 6A, it should also be noted that the LED chip locations for the multiple LED strings of the array (as denoted by the string numbers within each chip location) have symmetry with respect to the four axes of symmetry. The strings are laid out as symmetric pairs, such that string 1 and string 5 form a symmetric pair, string 2 and string 6 form a symmetric pair, string 3 and string 7 form a symmetric pair, and string 4 and string 8 form a symmetric pair, all with respect to the center 6A06 of the array. String 1 and string 7 form a symmetric pair, string 2 and string 8 form a symmetric pair, string 3 and string 5 form a symmetric pair, and string 4 and string 6 form a symmetric pair, all with respect to the horizontal axis H. String 1 and string 3 form a symmetric pair, string 2 and string 4 form a symmetric pair, and string 5 and string 7 form a symmetric pair, and string 6 and string 8 form a symmetric pair, all with respect to the vertical axis V. In addition, the LED chip locations within each string are symmetric with respect to one of the diagonal axes D1, D2 of symmetry. Other embodiments with different numbers of LED chips and different numbers of LED strings are possible, while maintaining symmetry with respect to the four axes of symmetry.

The present invention proposes the application of different phosphor materials over the tops of individual LED chips, which are spaced tightly together in an LED array. The phosphor material (typically of a single phosphor type, although in some embodiments multiple phosphor types could be mixed together) is mixed into a silicone gel material, which is dispensed as a viscous liquid, and then cured to become solid. The silicone gel is of high viscosity, and the dispensed quantity is well controlled, so that each LED chip is fully covered by the silicone gel with its intended phosphor type(s), without spreading to cover adjacent LED chips, since it may be desirable to apply a different phosphor type to these adjacent LED chips. Commercially available silicone gels for LED packaging applications are designed to be optically transparent throughout the visible light range of wavelengths, extending down to the UV range. They are also designed to have a well controlled index of refraction, for good light extraction from the surface of the LEDs.

Figure 11:
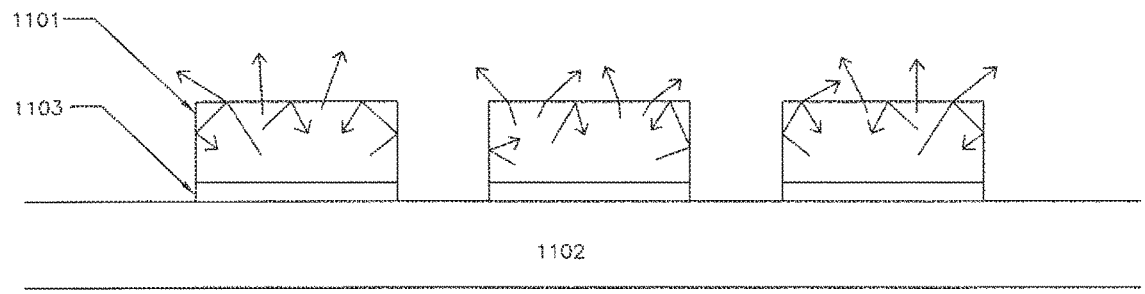
FIG. 11 shows a cross-section view of one embodiment of the LED array of the present invention, showing the LED chips in cross-section, prior to the application of a transparent silicone gel and phosphors, depicting the light emission characteristics of the LEDs.

FIG. 11 shows a cross-section view of a small portion of one embodiment of the LED array of the present invention, showing several of the LED chips (1101) in cross-section, prior to the application of the silicone gel and phosphor materials. This figure is not drawn to scale. As stated previously the lateral dimension of each LED chip is typically around 1 mm, although different LED chip sizes are possible. The space or gap between chips would generally be in the range of 100 μm to several hundreds of μm. The LED chips are bonded to the Metal Circuit Board (MCB) substrate (1102) using metallic solder (1103), for good thermal transfer. The arrow symbols represent light emission from within the LED chips. Light that is emitted by the active light-emitting epi-layer of the LED chips can escape the chip boundaries at both the top surface of the LED chip, and at its side surfaces, as long as the angle of incidence with the LED surface is within the critical angle that is defined by the relative indices of refraction of the LED chip material and the surrounding air. Without delving into the optics and physics involved, the net effect is that much of the light that is emitted by the LED's active light-emitting region can become "trapped" within the LED chip, due to internal reflection at the interfaces between the chip surface and the air. FIG. 11 shows a crude illustration of this phenomenon. This serves to reduce the efficiency of the LED's light emission, resulting in both lower light output and increased heat generation within the LED chip.

If a silicone gel that contains phosphor material is deposited only on the top surface of the LED chip, then some of the LED light emission out of the side walls of the chip will bypass the silicone gel and phosphor material. This can lead to excessive output at the LED chip's wavelength, and reduced output from the phosphor material, thereby creating "hot spots" in the spectral plot of the LED array, with reduced CRI. It also results in reduced excitation of the phosphor material, resulting in reduced light output.

Figure 12:
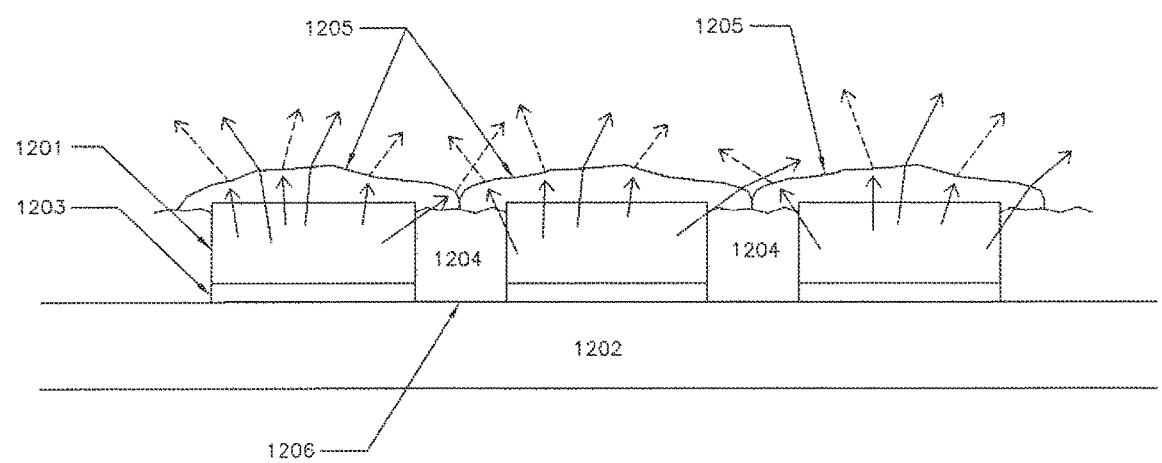
FIG. 12 shows a cross-section view of one embodiment of the LED array of the present invention, showing the LED chips in cross-section, after the application of transparent silicone gel and phosphors, depicting the improved light emission characteristics of the LEDs.

In order to both maximize the overall light output of the LED array, and also to avoid spectral "hot spots" caused by gaps in the coverage of the LED chips by the phosphor-containing silicone gel, the silicone gel and phosphor materials are applied to the LED array of the present invention in a two-step process, as depicted in FIG. 12. First, an optically-transparent silicone gel, without phosphors, is applied to the area (1204) between LED chips (1201), filling these areas (1204) up to the level of the top surfaces of the LED chips. The silicone gel is selected to have a high index of refraction, in order to maximize the emission of light through the side walls of the LED chips, and into the area of transparent silicone gel. Then, the multiple types of phosphor materials are applied to the tops of the designated individual LED chips, carried in an optically-transparent silicone gel (1205). The phosphor types that are used on relatively small numbers of chip sites would generally be applied first. The phosphor types that are used on larger numbers of chip sites are therefore applied last. However, the exact order of applying the different phosphor types is not critical. When the final (or later) phosphor types are being applied, the dispensed quantity of silicone gel (with phosphor material inside) is adjusted to ensure full coverage of the surface of the LED array, including coverage of the areas (1204) between LED chips that have previously been filled with transparent silicone gel, such that there are no gaps between LED chips where there is no phosphor-containing silicone gel. In other words, the silicone gel (with phosphor material inside) 1205 applied also covers the optically-transparent silicone gel, without phosphors, that has already been applied to fill the gaps 1204 between the LED chips, so that there is substantially no gap between the silicone gel (with phosphor material inside) 1205 that is applied on top of or above the LED chips.

The solid arrow symbols shown in FIG. 12 represent the light emission from the LED chips. The dashed arrow symbols represent the light emissions from the phosphor material that is embedded within the top layer of silicone gel. As depicted in FIG. 12, this phosphor and silicone gel application process results in good transfer of LED light emissions into the area of the silicone gel material that contains phosphors, such that the light emission from the phosphors is maximized. Some of the light emitted by the LED chips passes through the silicone gel area with phosphors, adding to the overall spectral plot of the LED array. However, voids or gaps in the phosphor-containing silicone gel layer are avoided, thereby minimizing spectral "hot spots" at the LED chips' wavelengths. This contributes to the LED array of the present invention possessing the desired attributes of both high efficiency, as well as high color/hue uniformity and homogeneity of its light output. Note also that the MCB (1202) substrate's top surface (1206), and the metallic solder layer (1203) that is underneath the LED chips, are both reasonably reflective in the visible light range, such that light that is directed downward will largely be reflected back upwards, thereby further increasing the overall light output from the LED array.

In order to vary the CCT of the LED illuminator of the present invention, it is necessary to provide an electronic control circuit that can independently control multiple channels or strings of LED chips, within the LED array. As shown in FIG. 6A, and in FIGS. 10A and 10B, the multiple LED channels or strings of the LED array of the present invention utilize LED chips with different wavelengths, and phosphor materials with different emissions spectra. The multiple LED channels or strings will therefore have differing CCT values when independently driven. By altering the relative brightness of the multiple LED channels or strings, the CCT of the combined light output may be adjusted, over a broad range of values.

Figure 13A:
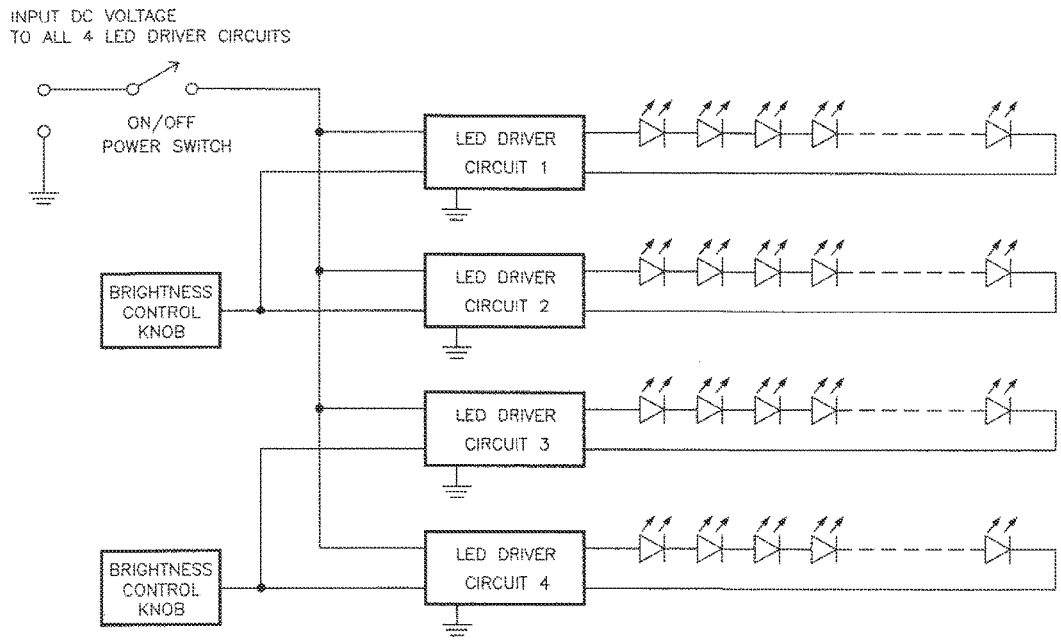
FIGS. 13A and 13B show schematic block diagrams of the electronic circuit of two embodiments of the present invention, showing the ability to separately control multiple strings of LEDs, thereby allowing control of both the intensity and CCT of the illuminator's light output.

FIG. 13A shows one embodiment of an electronic control circuit for the LED illuminator of the present invention. In this embodiment, the multiple LED channels or strings of the LED array are combined into four LED driver circuits, with a pair of manual control knobs to vary the brightness level of two sets of driver circuits. By connecting or configuring the LED array channels or strings with high CCT such that they are controlled by one of the manual control knobs, and connecting the LED array channels or strings with low CCT such that they are controlled by the other manual control knob, it is possible to achieve an overall CCT value that is anywhere between the CCT values of the two separately-controlled subsets of the LED array. For one skilled in the art of designing electronic control circuits for LEDs, it will be obvious that different implementations of driver circuits and controls can be used for additional embodiments of the present invention, to account for LED arrays with different numbers of LED chips, different numbers of separately controllable LED channels or strings, and different configurations of the multiple LED wavelengths and phosphor types.

Figure 13B:
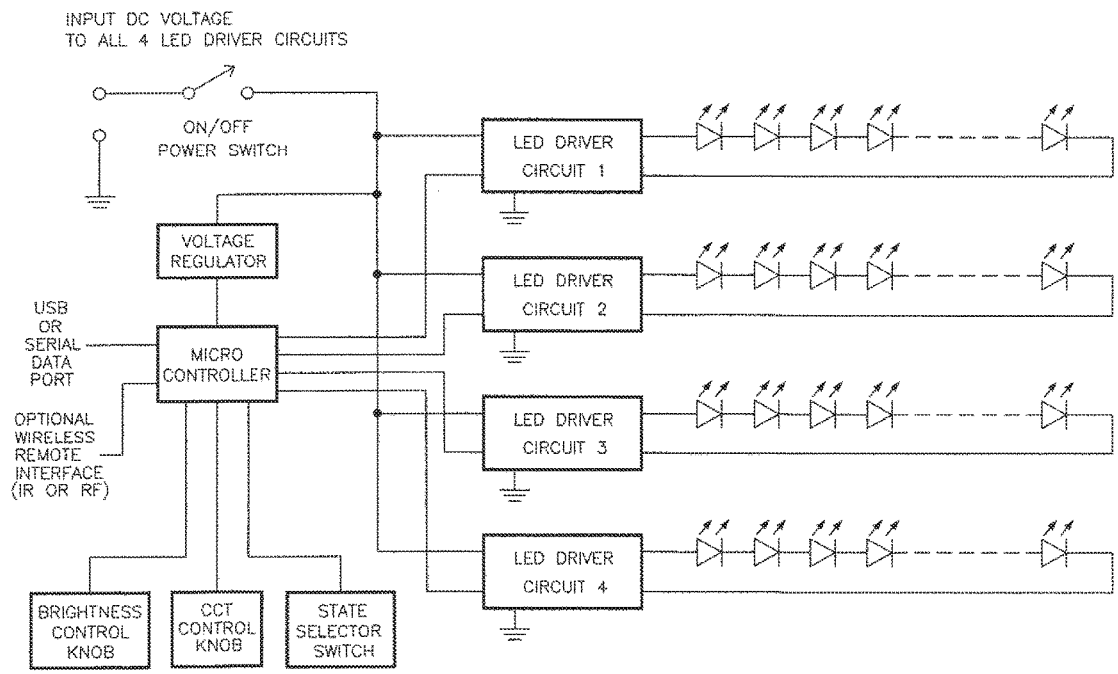

FIG. 13B shows another embodiment of an electronic control circuit for the LED illuminator of the present invention. In this embodiment, a microcontroller is used to control the four LED driver circuits. This microcontroller can interpret or accept control inputs from a variety of input types, including one or more state selector switches, one or more brightness control knobs, one or more CCT control knobs, serial control interfaces, or wireless control interfaces. Using information from one or more of these control interfaces, the microcontroller controls the brightness of the multiple LED driver circuits such that both the overall brightness and CCT of the LED illuminator are determined.

In one embodiment of the LED illuminator, using either of the electronic control embodiments shown in FIG. 13, or some other electronic control embodiment, the CCT of the combined light output of the LED array of the present invention can be adjusted from 2500K to 6500K, thereby spanning the CCT range from tungsten-filament incandescent light bulbs, to natural sunlight. This could be done by having a greater concentration of red phosphors in some of the LED channels or strings, to produce light with a CCT value of 2500K, and greater concentration of green phosphors (and to some extent yellow phosphors) in other LED channels or strings, such that they produce light with a CCT value of 6500K. An even broader range of CCT values is possible, for example from 2000K to 10,000K, with the 10,00K CCT value being achieved by using less phosphor material over the blue and indigo LED chips, such that relatively more blue light emerges. However, this broader range of CCT values would be accompanied by a reduction in the maximum light output obtainable at any given CCT value. For most applications in the fields of photography, videography, and motion picture lighting, the desired CCT range of a light source is usually within the range of 2500K to 6500K.

As discussed above, in order to ensure that the resulting combined light output has CIE chromaticity diagram color coordinates that lie on, or close to the ideal black body radiator curve, for all of the desired CCT values, it will usually be necessary to have at least three, and preferably four or more separately-controllable LED strings, with respective individual color coordinates that bracket or enclose the desired range of CCT value on the ideal black body radiator curve. This will allow for some variability in the color coordinates of the individual LED strings.

Since all of the LED channels or strings of the LED array of the present invention are implemented using a mix of one or more LED wavelengths and multiple phosphor types, extremely high CRI is maintained over the full range of CCT adjustment. This is in contrast to the prior art method of using red LEDs to "warm" the light output and thereby vary CCT. In the prior art method for adjusting or varying CCT, the spectral "hot spot" created by simply adding light from plain red LED chips can actually make the CRI value of the prior art illuminator worse, as its CCT is adjusted.

While the invention has been described above by reference to various embodiments, it will be understood that changes and modifications may be made without departing from the scope of the invention, which is to be defined only by the appended claims and their equivalents.

The invention claimed is:

1. An illumination apparatus, comprising:
   an LED array, said LED array including four or more strings of LED chips, wherein said strings of LED chips emit light of one or more different color coordinates in a CIE 1931 chromacity diagram of one or more wavelengths of blue, indigo and/or violet light, with peak wavelengths that are less than 490 nm;
   said LED array comprising bare LED chips that are mounted in close proximity to each other on a substrate;
   luminescent materials comprising multiple phosphor types or multiple quantum dots that are deposited on each of the LED chips in the LED array, said luminescent materials configured to emit light of different wavelength ranges that are of longer wavelengths than said light emitted from the LED chips, with the light emitted from the luminescent materials being in response to such light emissions from the LED chips, wherein color coordinates in the CIE 1931 chromaticity diagram of light emitted from the four or more strings of LED chips with the luminescent materials deposited thereon encloses a section of a black body radiator curve, the section having a high-Correlated Color Temperature (CCT) end point and a low-CCT end point, and wherein color coordinates of a first and a second string of the four or more strings with the luminescent materials deposited thereon fall respectively above and below the high-CCT end point on the CIE 1931 chromaticity diagram, and color coordinates of a third and a fourth string of the four or more strings with the luminescent materials deposited thereon bracket the low-CCT end point on the CIE 1931 chromaticity diagram, a control circuit configured to apply currents to the strings of LED chips causing the LED chips in the strings to emit light, which causes the luminescent materials to emit light of designated intensities and spectra; and a user interface configured to enable users to control the currents applied by the control circuit to the strings of LED chips to achieve in the light emitted by the strings of LED chips and the luminescent materials thereon, any CCT value and hue that are desired by users within a predetermined range of CCT values; and the apparatus having an output light exhibiting a substantially stabilized chromaticity and color temperature within the predetermined range of CCT values while maintaining high CRI (color rendering index) over the full range of CCT adjustments applied by the user interface.

2. The illumination apparatus of claim 1, wherein the user interface includes two or more knobs, with separate knobs for controlling an amplitude of current applied to the strings of LED chips, for the purpose of varying the CCT value and hue of light emitted by the illumination apparatus.

3. The illumination apparatus of claim 1, wherein a Color Rendering Index of said illumination apparatus is at least 95.

4. The illumination apparatus of claim 1, wherein said four or more strings of LED chips emit light of different color coordinates in the CIE 1931 chromaticity diagram of the one or more wavelengths of blue, indigo and violet light.

5. The illumination apparatus of claim 1, wherein said user interface enables users to control the currents applied by the control circuit to the strings of LED chips to achieve in the light emitted by the strings of LED chips and the luminescent materials thereon, any Correlated Color Temperature (CCT) value and hue with CIE 1931 chromaticity coordinates that lie on, or near to the black body radiator curve.

6. The illumination apparatus of claim 1, wherein said color coordinates of light emission from the four or more strings are within ±0.006 of the color coordinates of the black body radiator curve.

7. The illumination apparatus of claim 1, wherein said color coordinates of light emission from the four or more strings form a rectangle or parallelogram that straddles the section of the black body radiator curve having the high-CCT end and the low-CCT end.

\* \* \* \* \*